United States Patent
Chou et al.

(10) Patent No.: US 8,769,362 B2
(45) Date of Patent: Jul. 1, 2014

(54) DEBUGGING SYSTEM USING OPTICAL TRANSMISSION

(75) Inventors: Pai-Hsiang Chou, Taipei (TW);
An-Ping Wang, Hsinchu (TW); Shin-Yi Chang, Chiayi County (TW);
Cheng-Dao Lee, Taoyuan County (TW);
Chi-Yuan Lee, Kaohsiung (TW)

(73) Assignee: National Tsing Hua University, Hsinchu (TV)

( * ) Notice: Subject to any disclaimer, the term of this patent is extended or adjusted under 35 U.S.C. 154(b) by 183 days.

(21) Appl. No.: 13/530,811

(22) Filed: Jun. 22, 2012

(65) Prior Publication Data

US 2013/0283098 A1  Oct. 24, 2013

(30) Foreign Application Priority Data

Apr. 20, 2012  (TW) .............................. 101114172 A

(51) Int. Cl.
*G01R 31/28* (2006.01)
*G06F 11/00* (2006.01)
*G01R 31/317* (2006.01)
*G01R 31/3183* (2006.01)
*H04B 10/80* (2013.01)
*G02B 6/43* (2006.01)

(52) U.S. Cl.
CPC .... *G01R 31/31705* (2013.01); *G01R 31/31835* (2013.01); *H04B 10/801* (2013.01); *G02B 6/43* (2013.01)
USPC ............................................ 714/742; 714/25

(58) Field of Classification Search
CPC ................... G01R 31/31835; G01R 31/31705; H04B 10/801; H04B 10/07; G02B 6/43; G06F 11/0793; G06F 11/2294
USPC .......... 714/25, 718, 724, 742; 398/10, 16, 17, 398/22, 135, 202, 208
See application file for complete search history.

(56) References Cited

U.S. PATENT DOCUMENTS

| | | | | |
|---|---|---|---|---|
| 5,790,289 A | * | 8/1998 | Taga et al. | 398/79 |
| 7,319,824 B2 | * | 1/2008 | Fukumitsu | 398/208 |
| 8,290,372 B2 | * | 10/2012 | Oku | 398/135 |

* cited by examiner

*Primary Examiner* — Shelly A Chase
(74) *Attorney, Agent, or Firm* — Muncy, Geissler, Old & Lowe, P.C.

(57) ABSTRACT

A debugging system using optical transmission comprises a sending side and a receiving side. The sending side comprises a debugging-data-generation unit, a modulation unit, and an optical-transmission apparatus. The debugging-data-generation unit generates debugging data according to an operation of the sending side. The modulation unit modulates the debugging data to generate a modulation signal. The optical-transmission apparatus coupled to the modulation unit converts the modulation signal into a first light and transmits the first light. The receiving side comprises an optical-receiving apparatus, a demodulation unit and a data storage device. The optical-receiving apparatus receives the first light and converts the first light into the modulation signal. The demodulation unit is coupled to the optical-receiving apparatus and demodulates the modulation signal into the debugging data. The data storage device receives and saves the debugging data.

10 Claims, 3 Drawing Sheets

DEBUGGING SYSTEM USING OPTICAL TRANSMISSION

This application claims priority of No. 101114172 filed in Taiwan R.O.C. on Apr. 20, 2012 under 35 USC 119, the entire content of which is hereby incorporated by reference.

BACKGROUND OF THE INVENTION

1. Field of the Invention

The invention related to a debugging system, and more particularly to a debugging system using optical transmission.

2. Related Art

A conventional method to debug a system is transferring the debugging data (or debugging message) from the system under debugging ("the target system") to a specific apparatus (e.g., computer) through a wired interface. Under the restriction of the wired interface, the debugging system achieves insufficient scalability. If the target system is located at a position that cannot be reached easily, the difficulty of deploying the wired transmission interface will also increase.

Currently, a well-known technique to transfer the debugging data to a specific displaying platform is through the radio frequency (RF), but the radio frequency signal will be restricted by the transmission distance and tends to be negatively affected by the multi-path interference.

SUMMARY OF THE INVENTION

An object of the invention is to provide a low-cost debugging system.

Another object of the invention is to provide a debugging system with the capability of transmitting the debugging data through an optical interface.

An embodiment of the invention provides a debugging system using optical transmission. The debugging system comprises a sending side and a receiving side. The sending side comprises a debugging data generation unit, a modulation unit, and an optical-transmission apparatus. The debugging data generation unit generates debugging data according to an operation on the sending side. The modulation unit modulates the debugging data to generate a modulated signal. The optical-transmission apparatus is coupled to the modulation unit, converting the modulated signal into a first light pulse and transmits the first light pulse. The receiving side comprises an optical receiving apparatus, a demodulation unit, and a data storage device. The optical receiving apparatus receives the modulated first light pulse. The demodulation unit is coupled to the optical receiving apparatus and demodulates the modulated signal to restore the debugging data. The data storage device receives and saves the debugging data. A user can perform a procedure of detecting and possibly correcting any error by checking the received data from the storage device.

Further scope of the applicability of the present invention will become apparent from the detailed description given hereinafter. However, it should be understood that the detailed description and specific examples, while indicating preferred embodiments of the present invention, are given by way of illustration only, since various changes and modifications within the spirit and the scope of the present invention will become apparent to those skilled in the art from this detailed description.

BRIEF DESCRIPTION OF THE DRAWINGS

The present invention will become more fully understood from the detailed description given herein below and the accompanying drawings, which are given by way of illustration only, and thus are not limitative of the present invention.

DETAILED DESCRIPTION OF THE INVENTION

The present invention will be apparent from the following detailed description, which proceeds with references to the accompanying drawings.

Figure 1:
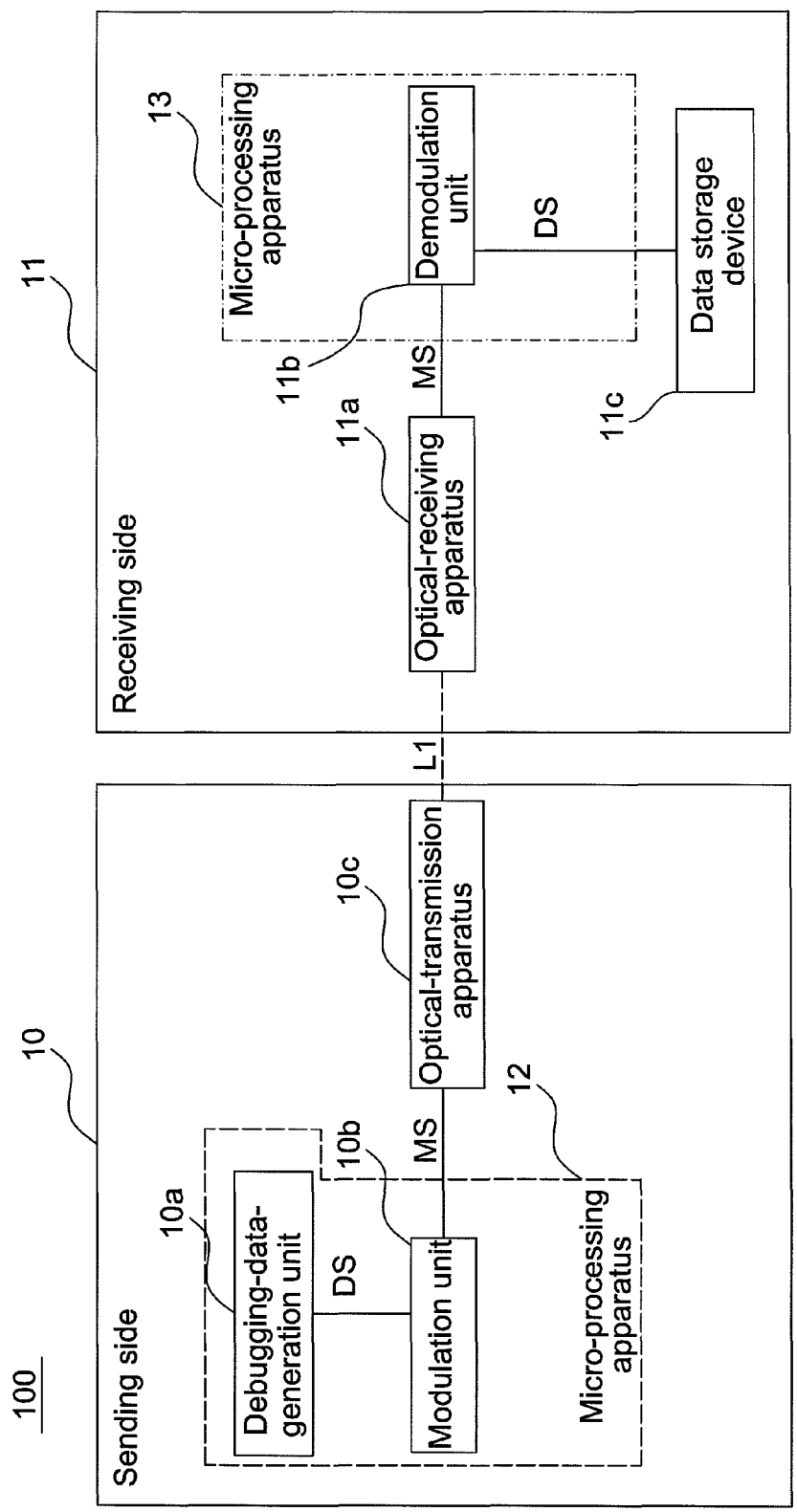
FIG. 1 is a schematic illustration showing a debugging system according to an embodiment of the invention.

FIG. 1 is a schematic illustration showing a debugging system 100 according to an embodiment of the invention. Referring to FIG. 1, the debugging system 100 of this embodiment operates through the optical transmission and comprises a sending side 10 and a receiving side 11.

The sending side 10 comprises a debugging data generation unit 10a, a modulation unit 10b, and an optical-transmission apparatus 10c. The debugging data generation unit 10a generates a debugging data DS according to an operation condition of the sending side 10. The modulation unit 10b coupled to the debugging data generation unit 10a modulates the debugging data DS to generate a modulated signal MS. In one embodiment, the modulation unit 10b and the debugging data generation unit 10a are disposed in a micro-processing apparatus 12, and the modulation unit 10b may be implemented by firmware. The optical-transmission apparatus 10c coupled to the modulation unit 10b and converts the modulated signal MS into a light L1 and transmits the light L1. Consequently, the debugging data DS can be converted into the light L1 and transmitted in the form of the light L1. In other words, the sending side 10 utilizes the light L1 to transmit the debugging data DS to the receiving side 11.

Please note that, in one embodiment of the invention, the modulation unit 10b modulates the debugging data DS by way of the differential pulse position modulation (DPPM) scheme, for converting the debugging data DS into a binary waveform. In one embodiment, the optical-transmission apparatus 10c may also be implemented by an existing or a future apparatus that can generate light, such as a light-emitting diode (LED) or a laser diode (LD).

The receiving side 11 comprises an optical receiving apparatus 11a, a demodulation unit 11b, and a data storage device 11c. The optical receiving apparatus 11a receives the light L1 and converts the light L1 into the modulated signal MS. Please note that, in one embodiment of the invention, the optical receiving apparatus 11a may be implemented by the existing or future apparatus capable of receiving the light, such as a camera on a mobile phone, a photo diode, a photovoltaic device, or a light sensor.

The demodulation unit 11b is coupled to the optical receiving apparatus 11a and demodulates the modulated signal MS to restore the debugging data DS. The data storage device 11c receives and saves the debugging data DS. A user reads the data storage device 11c to understand whether the sending side operates according to the normal program flow so that errors can be detected on-line or off-line. In one embodiment, the demodulation unit 11b is disposed in a micro-processing apparatus 13, and the demodulation unit 11b may be implemented by the software/firmware. In addition, the demodulation unit 11b demodulates the modulation signal MS by way of DPPM to convert the modulation signal MS from the binary waveform back into the debugging data DS.

Figure 2:
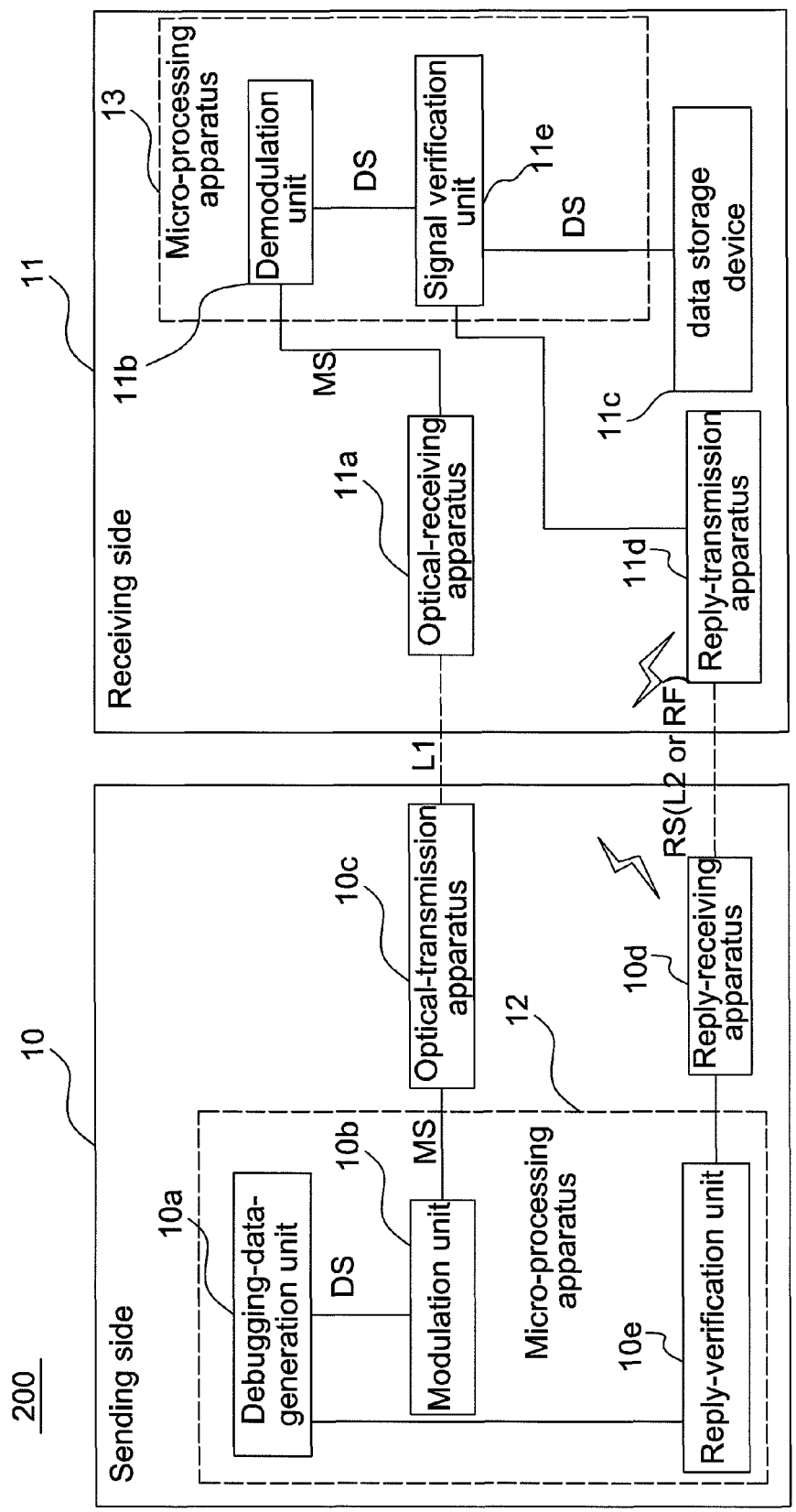
FIG. 2 is a schematic illustration showing a debugging system according to an embodiment of the invention.

FIG. 2 is a schematic illustration showing a debugging system 200 according to an embodiment of the invention. As shown in FIG. 2, the difference between the debugging systems 100 and 200 resides in that the receiving side 11 of the debugging system 200 further comprises a reply-transmission apparatus 11d and a signal verification unit 11e, while the sending side 10 correspondingly comprises a reply-receiving apparatus 10d and a reply verification unit 10e.

Please note that, in one embodiment, the signal verification unit 11e is disposed in a microprocessor apparatus 13. The signal verification unit 11e is coupled between the demodulation unit 11b and the data storage device 11c, and the demodulation unit 11b transmits the debugging data DS to the signal verification unit 11e so that the further signal verification can be performed. Since the error or interference may occur during the process of receiving the optical signal, the signal demodulated by the demodulation unit 11b may have errors. Thus, the signal verification unit 11e is utilized to perform the final authentication, and the verified debugging data DS is further transmitted to the data storage device 11c for receiving and saving. The signal verification unit 11e controls the reply-transmission apparatus 11d to transmit a reply signal RS to the reply-receiving apparatus 10d.

Herein, please note that the reply-receiving apparatus 10d of this embodiment is coupled to the reply-verification unit 10e. When the reply-receiving apparatus 10d does not receive the reply signal RS, the optical transmission apparatus 10c continues retransmitting the light L1. Correspondingly, after the reply-receiving apparatus 10d receives the reply signal RS and transmits the reply signal RS to the reply verification unit 10e to perform the signal verification correctly, the reply verification unit 10e controls the debugging data generation unit 10a to make the debugging data generation unit 10a generate a new debugging data DS. Consequently, it is possible to ensure that the receiving side 11 receives each debugging data DS.

In addition, in one embodiment of the invention, the reply-receiving apparatus 10d may be a radio-frequency-receiving apparatus, and the reply-transmission apparatus 11d may be a radio-frequency-transmission apparatus. In this case, the reply signal RS may be a radio-frequency signal. In another embodiment, the reply-transmission apparatus 11d may be a light-emitting diode (LED), a laser diode or any existing or future apparatus capable of generating light. The reply-receiving apparatus 10d may be an optical-sensor apparatus. At this time, the reply signal RS may be a light L2.

Please note that, if the reply signal RS is the light L2, the reply-receiving apparatus 10d senses and transmits the light intensity of the light L2 to the reply verification unit 10e, which judges whether the light intensity of the light L2 is higher than a threshold value. If so, then the debugging data generation unit 10a generates a new debugging data DS. In other words, the sending side 10 can determine whether to continue transmitting the new debugging data DS according to the feedback light intensity of the light L2.

Figure 3:
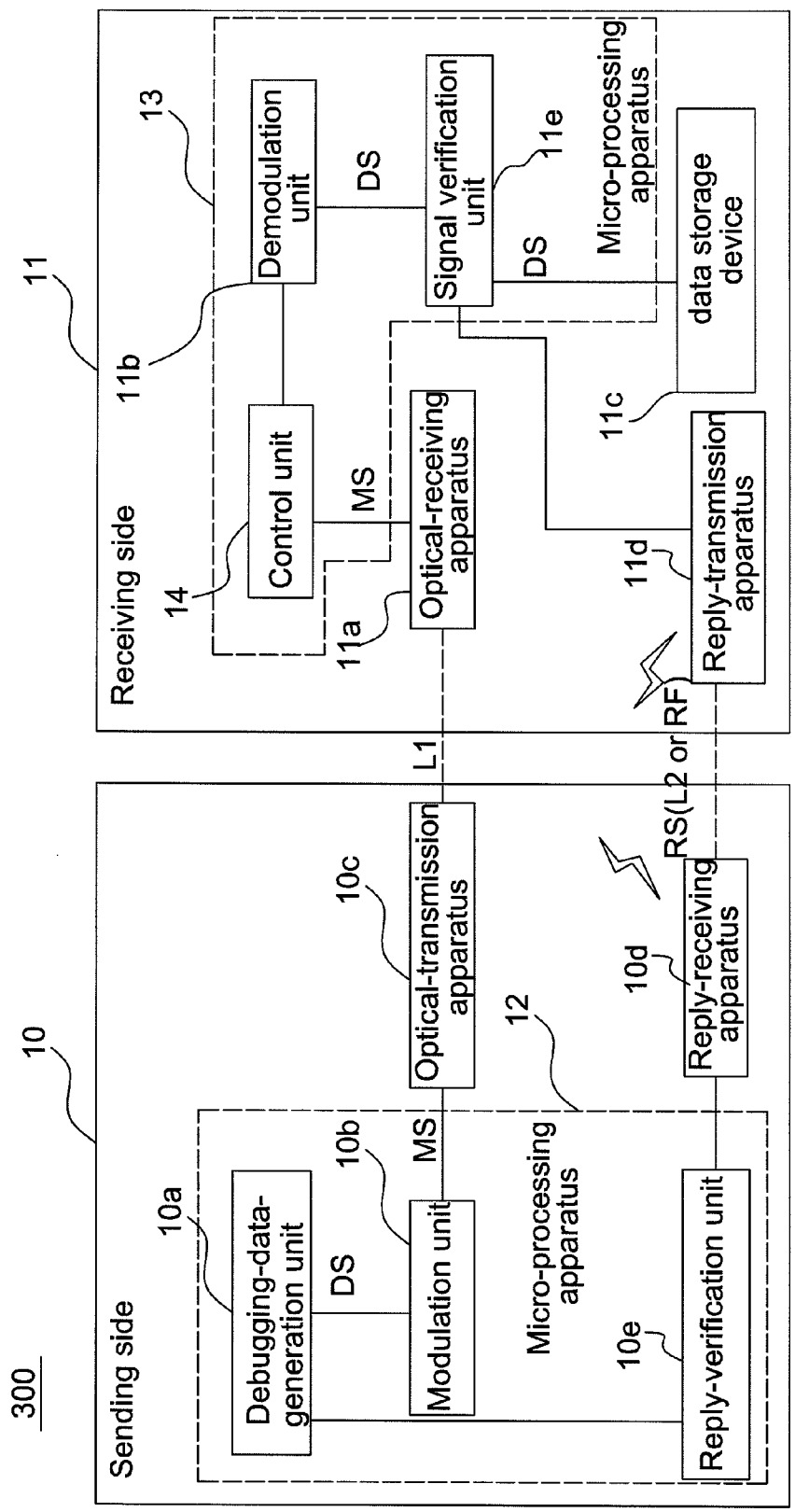
FIG. 3 is a schematic illustration showing a debugging system according to an embodiment of the invention.

FIG. 3 is a schematic illustration showing a debugging system 300 according to an embodiment of the invention. As shown in FIG. 3, the difference between the debugging systems 300 and 200 resides in that the receiving side 11 of the debugging system 300 further comprises a control unit 14, which is disposed in a microprocessor apparatus 13 and coupled between the optical-receiving apparatus 11a and the demodulation unit 11b. The control unit 14 acquires the light L1 of the optical-receiving apparatus 11a in a predetermined coordinate region.

In the following example, the reply signal RS of this embodiment is a light L2. Please also refer to the control functions of the sending side 10 concurrently.

```
/* The optical-transmission apparatus 10c is initialized, wherein the
optical-transmission apparatus 10c of this embodiment is a LED */
eco_led_init( );
/* The reply-receiving apparatus 10d is initialized, wherein the
reply-receiving apparatus 10d of this embodiment is an optical-sensor
apparatus */
eco_op521_init( );
/* Select the information output using LED */
TYPE = _LED;
While(1)//loop
{
/* When the reply-receiving apparatus 10d (the OP521 is the model
of the optical-sensor apparatus) receives the reply signal RS of the
receiving side 11, it transmits the reply signal RS to the reply
verification unit 10e, which judges whether the light intensity of the
reply signal RS (light L2) is higher than the predetermined threshold
value. If so, then the next debugging data DS is processed */
if(read_light_feedback(op521))
/* The next debugging data DS is inputted */
epl_std_print("My Message",0);
}
```

Please also refer to the control functions of the receiving side 11 concurrently, as expressed in ObjectiveC-like syntax for iPhone programming:

```
/* This function is enabled when the user clicks the screen of the
optical-receiving apparatus 11a, and records the clicked coordinate */
touchesBegan:(NSSet *)touches withEvent: (UIEvent *)event;
/* This function reads the image data of the optical-receiving
apparatus 11a and saves the image color of the user's clicked
coordinate */
ProcessNewCameraFrame: (CVImageBufferRef) cameraframe;
/* This function checks whether there is any matched image color in
the region of the user's clicked coordinate */
Find_Touched_Pixels(GLubyte *)pixels;
/* This function checks whether there is any LED image in the
selected region according to the previous function
and calculates the ratio of the number of presence of image to the
number of absence of image to judge the modulation pattern of signal,
and then reproduces the signal into binary values and converts the
signal back into the debugging data DS
*/
Object_tracking( );
/* In this function, the receiving side 11 controls the LED flash light of
the mobile phone to reply to the sending side 10 after successfully
verifying the information through the signal-verification unit */
Send_Feedback( );
```

According to the above-mentioned functions, it is realized that the sending side 10 initializes the optical-transmission apparatus 10c and the reply-receiving apparatus 10d through the functions eco_led_init( ) and eco_op521_init( ), respectively. Next, the modulation signal MS is converted into a light L1, and the corresponding light L1 is transmitted through the optical-transmission apparatus 10c.

When the user clicks the screen of the optical-receiving apparatus 11a, the control unit 14 on the receiving side acquires the image data received and saved by the optical-receiving apparatus 11a in a user-defined coordinate region. Also, the control unit 14 determines whether the demodulation unit 11b has to demodulate the modulated signal MS according to whether the image color in the user-defined coordinate region contains the light L1.

Please note that, in one embodiment, the control unit 14 determines whether the demodulation unit 11b needs to demodulate the signal MS according to the number or ratio of occurrences of the image color.

In summary, the debugging system of the invention optically transmits the debugging data. Therefore, physical wired connection between the sending side and the receiving side is unnecessary, and the invention is not restricted to the wired interface. In addition, the property of performing the long distance transmission through the light can solve the problem of the limited transmission distance of radio-frequency signal and the problem that the radio-frequency signal tends to be negatively affected by the multipath interference.

While the present invention has been described by way of examples and in terms of preferred embodiments, it is to be understood that the present invention is not limited thereto. To the contrary, it is intended to cover various modifications. Therefore, the scope of the appended claims should be accorded the broadest interpretation so as to encompass all such modifications.

What is claimed is:

1. A debugging system using optical transmission, the debugging system comprising a sending side and a receiving side, wherein:

the sending side comprises:
- a debugging-data-generation unit generating a debugging data;
- a modulation unit modulating the debugging data to generate a modulated signal; and
- an optical-transmission apparatus, which is coupled to the modulation unit, converting the modulation signal into a first light and transmits the first light; and the receiving side comprises:
- an optical-receiving apparatus receiving the first light and converting the first light into the modulated signal;
- a demodulation unit, which is coupled to the optical-receiving apparatus and demodulates the modulation signal into the debugging data; and
- a data storage device receiving and saving the debugging data, wherein a user reads the debugging data in the data storage device to perform a procedure of detecting and eliminating the errors from debugged apparatus.

2. The system according to claim 1, wherein the receiving side further comprises:

a signal verification unit, which is coupled to the demodulation unit and the data storage device, verifying whether the signal-receiving procedure is completed according to the debugging data;

a reply-transmission apparatus, which is coupled to the signal-verification unit and transmits a reply signal according to the signal verification unit; and the sending side further comprises:

a reply receiving apparatus receiving the reply signal; and a reply-verification unit, which is coupled between the reply-receiving apparatus and the debugging data generation unit, wherein when the debugging data is completely decoded, the data storage device receives and saves the debugging data, and the reply-transmission apparatus transmits the reply signal to the reply-receiving apparatus.

3. The system according to claim 2, wherein the receiving side further comprises a control unit, the control unit is coupled between the optical-receiving apparatus and the demodulation unit, and the control unit acquires the first light of the optical-receiving apparatus in a predetermined coordinate region.

4. The system according to claim 2, wherein the control unit determines whether the demodulation unit has to demodulate the modulated signal according to a number or a ratio of occurrences of image colors in the predetermined coordinate region.

5. The system according to claim 1, wherein the modulation unit modulates the debugging data by way of differential pulse position modulation (DPPM), and the demodulation unit demodulates the modulated signal by way of the DPPM.

6. The system according to claim 3, wherein the optical-receiving apparatus determines whether to convert the first light into the modulated signal according to a number of receipts of the first light.

7. The system according to claim 2, wherein the optical-transmission apparatus continuously transmits the first light when the debugging data generation unit does not receive the reply signal; the reply-verification unit verifies the reply signal when the debugging data generation unit receives the reply signal; and the reply-verification unit controls the debugging-data-generation unit to generate a new debugging data when the reply signal is verified.

8. The system according to claim 4, wherein the reply signal is a radio-frequency signal or a second light.

9. The system according to claim 8, wherein the debugging-data-generation unit determines whether to generate the new debugging data according to a luminance of the second light received by the reply-receiving apparatus.

10. The system according to claim 9, wherein if the light intensity of the second light is higher than a threshold value, the debugging data generation unit generates a new debugging data.

* * * * *